US012764896B2

(12) United States Patent
Patil et al.

(10) Patent No.: US 12,764,896 B2
(45) Date of Patent: Oct. 13, 2026

(54) CONTROLLER WITH COOLING

(71) Applicant: EATON INTELLIGENT POWER LIMITED, Dublin (IE)

(72) Inventors: Sachin Appasaheb Patil, Pune (IN); Divyanshu Bhardwaj, Pune (IN); Sunny R. Pawar, Pune (IN); Sauradeep Datta, Pune (IN); Derek Paul Dougherty, Fruitport, MI (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 191 days.

(21) Appl. No.: 18/620,759

(22) Filed: Mar. 28, 2024

(65) Prior Publication Data

US 2024/0334642 A1 Oct. 3, 2024

(30) Foreign Application Priority Data

Mar. 31, 2023 (IN) ............................ 202311024491

(51) Int. Cl.
*H05K 7/20* (2006.01)

(52) U.S. Cl.
CPC ..... *H05K 7/20145* (2013.01); *H05K 7/20154* (2013.01); *H05K 7/20336* (2013.01); *H05K 7/20409* (2013.01)

(58) Field of Classification Search
CPC ........... H05K 7/20145; H05K 7/20154; H05K 7/20336; H05K 7/20409; H05K 7/20863; H05K 7/20136–20163
See application file for complete search history.

(56) References Cited

U.S. PATENT DOCUMENTS 4,851,965 A * 7/1989 Gabuzda ............ H05K 7/20154 361/822
9,333,599 B2 5/2016 de Bock et al.
10,136,557 B2 11/2018 Kim et al.
10,561,041 B2 2/2020 Bozorgi
11,672,101 B2 * 6/2023 Dawkins ............ H05K 7/20336 361/710
11,997,812 B2 * 5/2024 Fine ....................... H05K 5/061
2009/0086431 A1 * 4/2009 Sakamoto .......... H05K 7/20009 361/796

(Continued)

FOREIGN PATENT DOCUMENTS

CN 113630993 A * 11/2021 ......... H05K 7/20172
WO 2021256021 A1 12/2021
WO 2023037856 A1 3/2023

OTHER PUBLICATIONS

Zhu Longfei, "Case, power amplifier and communication equipment", Nov. 9, 2021, Guangzhou Haige Communication Group Inc Co, Entire Document (Translation of CN113630993). (Year: 2021).*

(Continued)

*Primary Examiner* — Stephen S Sul
(74) *Attorney, Agent, or Firm* — Merchant & Gould P.C.

(57) ABSTRACT

The present disclosure relates to an electric motor controller having a plenum with a second wall designed to be angled to improve heat dissipation. The electric motor controller can have a plurality of circuit boards arranged in a stacked configuration within a sealed interior region of the housing. In certain examples, the controller may have vapor chambers for cooling a plurality of circuit boards.

22 Claims, 14 Drawing Sheets

(56) References Cited

U.S. PATENT DOCUMENTS

| | | | | |
|---|---|---|---|---|
| 2017/0352608 | A1 | 12/2017 | Sueyoshi et al. | |
| 2019/0327858 | A1* | 10/2019 | Sun | H05K 7/20909 |
| 2019/0335621 | A1* | 10/2019 | Szostek | H05K 7/20172 |
| 2021/0006190 | A1* | 1/2021 | Largent | H02K 5/15 |
| 2023/0047487 | A1* | 2/2023 | Coles | H02K 9/10 |
| 2023/0156903 | A1* | 5/2023 | Teranishi | H05K 7/20454 361/704 |
| 2024/0155816 | A1* | 5/2024 | Matsuoka | H05K 7/20863 |
| 2025/0240934 | A1* | 7/2025 | Teranishi | H05K 7/20863 |

OTHER PUBLICATIONS

Boyd Corporation, Two Phase Thermal Solution Guide, Quick & Easy Reference to Two Phase Thermal Solutions; www.boydcorp.com; Feb. 2022; 13 pages.

Preliminary Search Report w/translation for French Application No. 2403338 dated Jul. 28, 2026 (13 pages).

* cited by examiner

CONTROLLER WITH COOLING

REFERENCE TO RELATED APPLICATION

This application claims the benefit of India Provisional Patent Application No. 202311024491, filed on Mar. 31, 2023, the disclosure of which is incorporated herein by reference in its entirety.

TECHNICAL FIELD

The present disclosure relates to cooling systems for electric motor controllers.

BACKGROUND

Electric motor controls have power boards which generate heat during operation that must be cooled to maintain operational temperatures. Heat sinks may be provided within the controller housing to absorb heat from the power board in order to remove heat. A plurality of circuit boards or circuit cards may be placed in an assembly within one body to be cooled. The assembly of boards may be cooled by two-phase heat transfer mechanisms such as vapor chambers or thermal skeletons. Examples of heat dissipation are shown in U.S. Pat. No. 10,136,557B2 and U.S. Pat. No. 9,333,599B2.

SUMMARY

One aspect of the present disclosure relates to an electric motor controller including a housing having an interior. A plurality of circuit boards are arranged in a stacked configuration within the interior. The plurality of circuit boards include at least a first circuit board and a second circuit board.

A first wall of the housing has a heat sink integrated with the first wall. The heat sink includes a plurality of cooling fins located outside the interior of the housing. The plurality of cooling fins define an air-flow channel between each of the cooling fins. The first circuit board includes heat generating components positioned on the first circuit board. The heat sink is configured to transfer heat generated by the heat generating components on the first circuit board from the interior to the cooling fins.

A plenum directs air flow from a forced air source to the air flow channels. The plenum defines a second wall separating the plenum from the interior of the housing. The second wall is obliquely angled relative to a direction of air flow of the air from the forced air source. Air which is directed through the plenum flows over the second wall and through the air-flow channels.

A variety of additional inventive aspects will be set forth in the description that follows. The inventive aspects can relate to individual features and to combinations of features. It is to be understood that both the forgoing general description and the following detailed description are exemplary and explanatory only and are not restrictive of the broad inventive concepts upon which the embodiments disclosed herein are based.

DETAILED DESCRIPTION

One aspect of the present disclosure relates to an electric motor controller having features providing advanced cooling to electrical components. In the depicted example the controller is made specifically for motors, but in other examples any electric controller may utilize the features for advanced cooling.

Another aspect relates to an angled wall specifically configured to reduce backpressure or pressure drops when directing air from a forced air source over a heat sink. It will be appreciated that the structure provides advanced air flow through the housing improving cooling of the largest heat generating circuit board. In certain examples, a forced air source is used to direct air flow through a plenum and over an angled wall defined by the plenum. In the depicted example, the forced air source is a fan; however, in certain examples the forced air source could be any forced air source such as a blower or compressed air.

One aspect relates to the cooling structures contacting a heat sink which create air passages for cooling a circuit board generating large amounts of heat. In the depicted example, cooling fins are used; however, any cooling structure may be utilized.

Another aspect relates to a notch for circulating air within the plenum. In the depicted example, the notch is located against a second end of the second wall. In other examples, the notch may be located anywhere within the plenum. By positioning the notch at other locations within the plenum, air circulation within the notch may improve cooling of the housing at the location of the notch.

Figure 1:
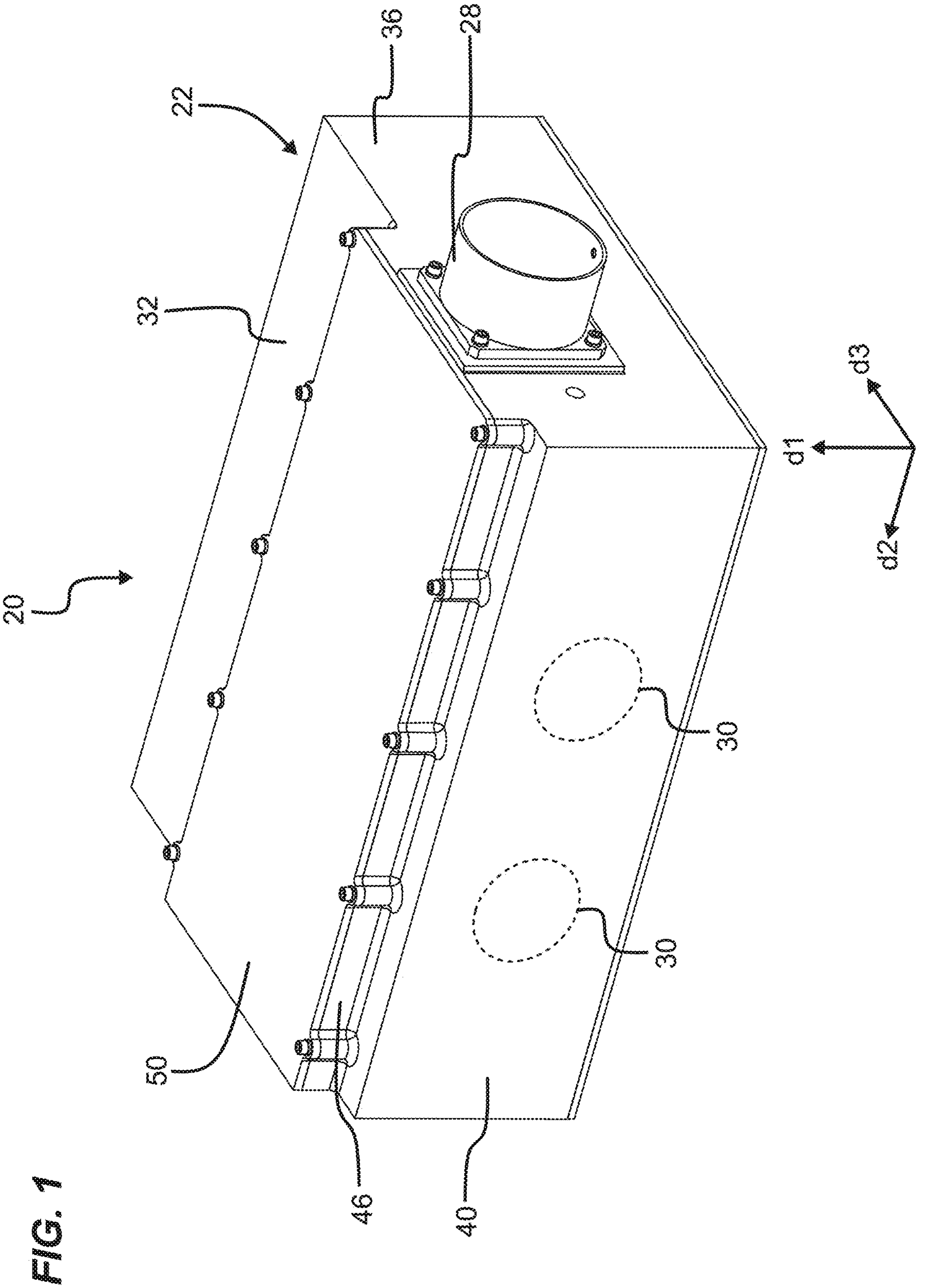
FIG. 1 is a frontal perspective view of the electric motor controller.
Figure 2:
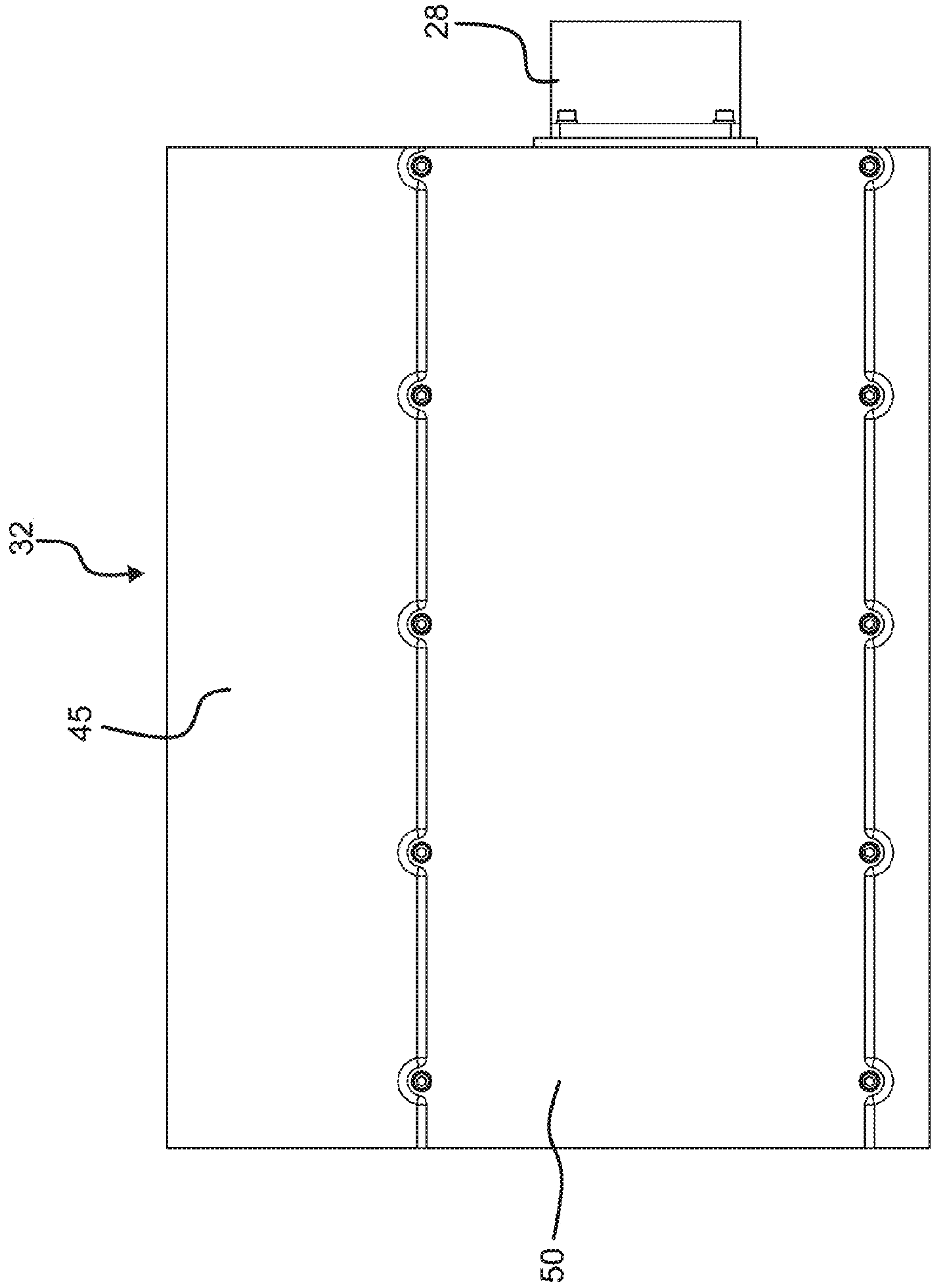
FIG. 2 is top view of the electric motor controller of FIG. 1.

FIG. 1 depicts an electric motor controller 20 for a motor in accordance with the principles of the present disclosure. The electric motor controller 20 includes a housing 22 having a sealed interior region 24 (shown in FIG. 7), and a forced air source 28. The housing includes a first side 32 and a second side 34 separated by a first dimension d1. The first and second sides 32, 34 are positioned opposed to each other. The housing further includes a third side 36 (shown in FIG. 2) and fourth side 38 that extend between the first and second sides 32,34 and that are separated by a second dimension d2 that is transverse with respect to the first dimension d1. The housing further includes a fifth side 40 and sixth side 42 that extend between the first side 32 and second side 34 and also extend between the third side 36 and fourth side 38. The fifth and sixth sides 40,42 are separated by a third dimension d3 that is transverse with respect to the first dimension d1 and the second dimension d2. The forced air source 28 can be any source of forced air flow. As non-limiting examples, the forced air source 28 could be a fan, blower, or compressed air source. A plurality of connectors 30 provide electrical connections into the housing 22, and the connectors 30 may be positioned anywhere on the housing 22. Example positions of the connectors 30 are indicated by the dashed circles on the fifth side 40 of the housing 22. The plurality of connectors 30 may be sealed.

The housing's first side 32 includes a heat sink 44 (shown in FIG. 7) integrated with a first wall 45. A heat sink cooling chamber 46 extends along the exterior of the heat sink 44 for extracting heat from the heat sink 44. The heat sink 44 includes a plurality of spaced-apart cooling fins 48 (shown in FIG. 6) located outside the sealed interior region 24. The cooling fins 48 are positioned within the heat sink cooling chamber 46. A cover 50 (shown in FIG. 5) is provided for enclosing the heat sink cooling chamber 46. The heat sink 44 being configured to transfer heat generated by the power modules 51 from the sealed interior region 24 to the cooling fins 48. The heat sink cooling chamber 46 is raised in height relative to the first wall 45 allowing the cover 50 to be placed over the heat sink cooling chamber 46. The cover 50 is aligned with a plurality of air-flow channels 52 (shown in FIG. 6), and longitudinally with the raised height of the heat sink cooling chamber 46 along the dimension d2. The cover 50 may be attached to a main body of the housing 22 by fasteners.

Figure 3:
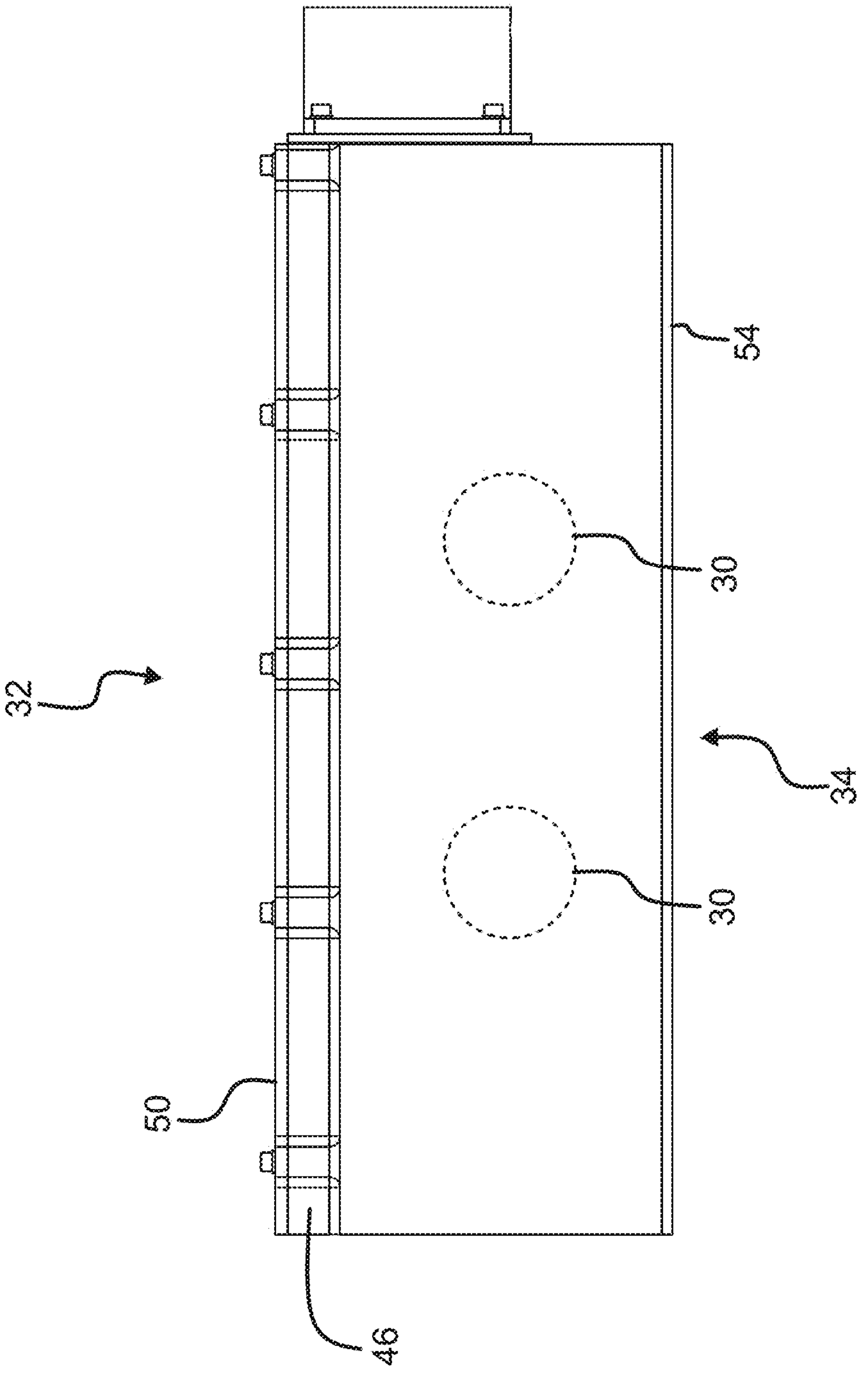
FIG. 3 is a side view of the electric motor controller of FIG. 1.
Figure 4:
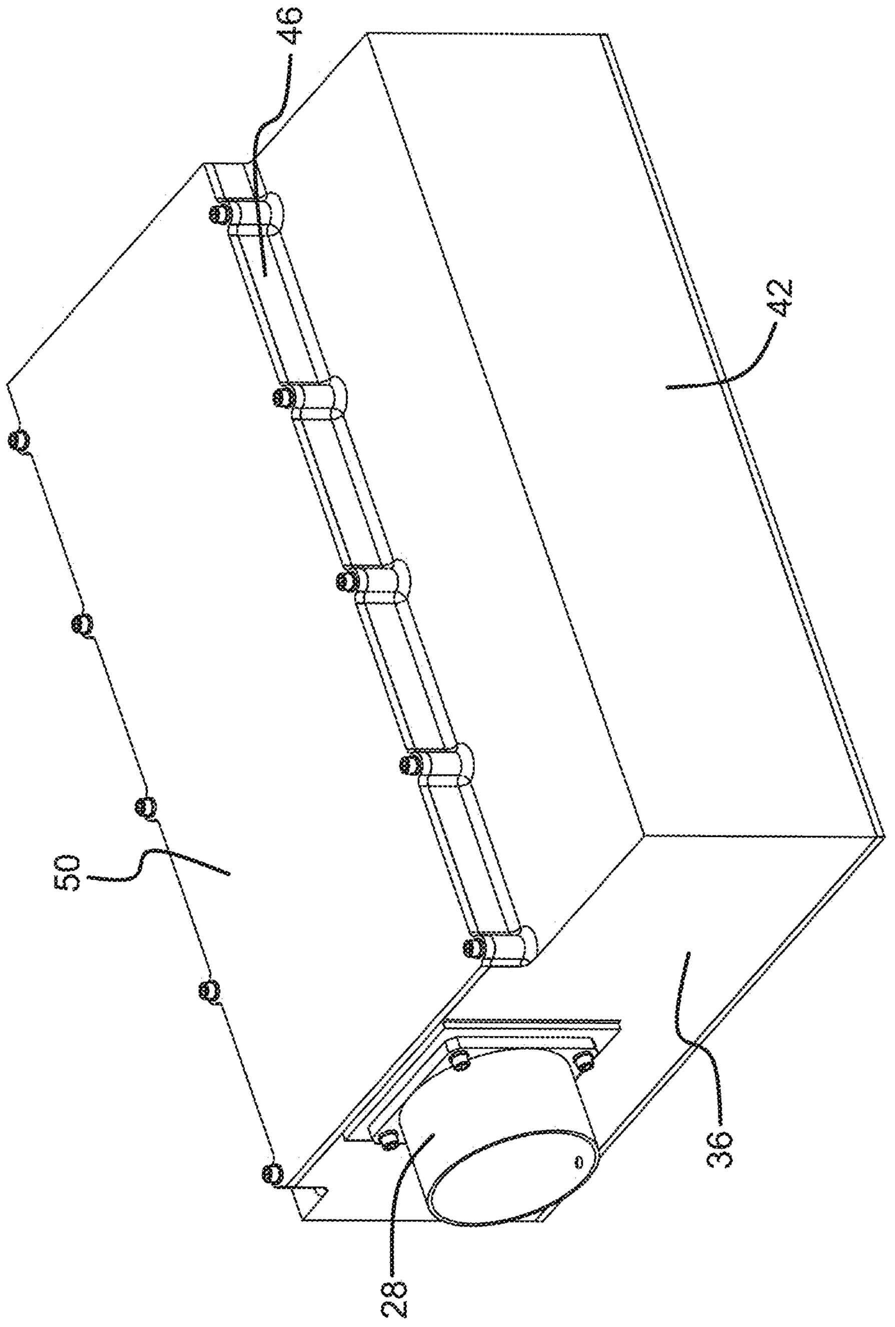
FIG. 4 is back perspective view of the electric motor controller of FIG. 1.
Figure 5:
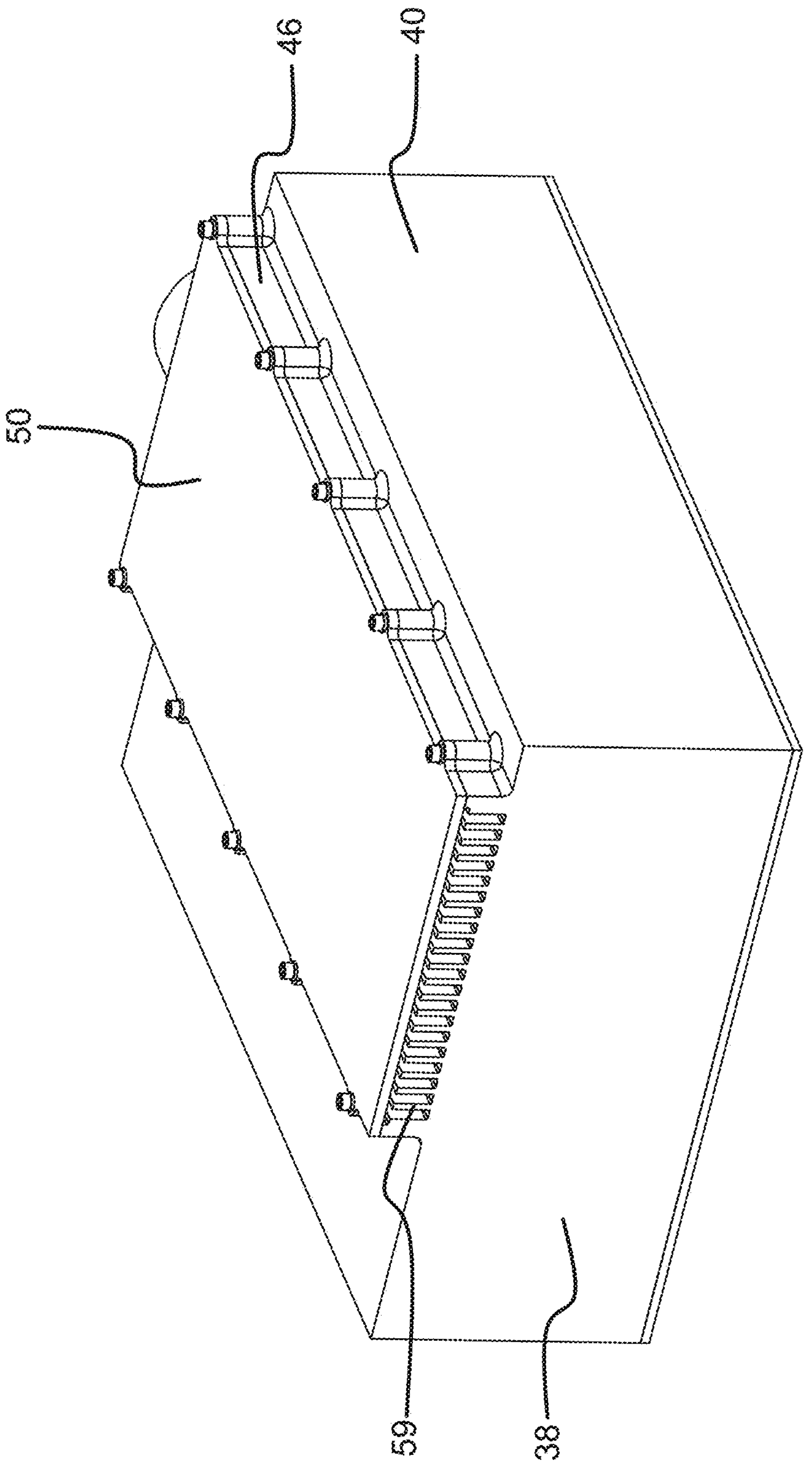
FIG. 5 is a perspective side view of the electric motor controller of FIG. 1.

FIGS. 2-5 shows the exterior of the housing 22. The first wall 45 (shown in FIG. 7) has an inner surface that is exposed to the sealed interior region 24, and an exterior surface that is exposed to the heat sink cooling chamber 46. The exterior surface has cooling fins 48 that will transfer heat to air flow within the heat sink chamber. FIG. 3 shows the second side 34 includes a bottom cover 54. The housing 22 defines an air-flow plenum 58 (shown in FIG. 6) at the third side 36 of the housing for directing air flow from a forced air source 28 to the air-flow channels 52. The third side 36 includes the forced air source 28 which increases air flow passing through the air-flow plenum 58. FIG. 4 shows the sixth side 42. FIG. 5 shows the fourth side 38 comprising an air exit 59 in the heat sink cooling chamber 46 allowing air blown by the forced air source 28 to exit the heat sink cooling chamber 46.

Figure 6:
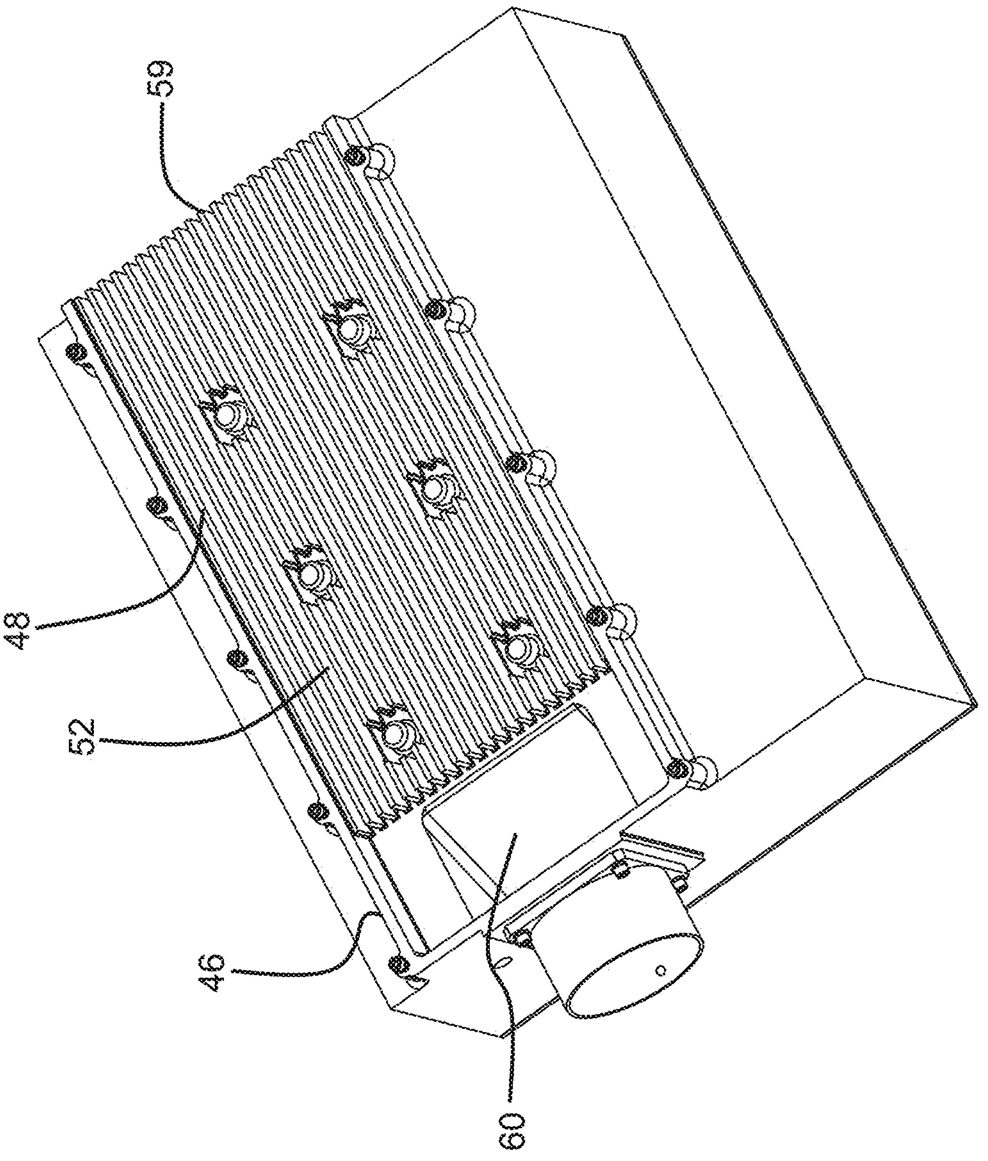
FIG. 6 a top perspective view of the electric motor controller of FIG. 1 with the top cover removed.
Figure 7:
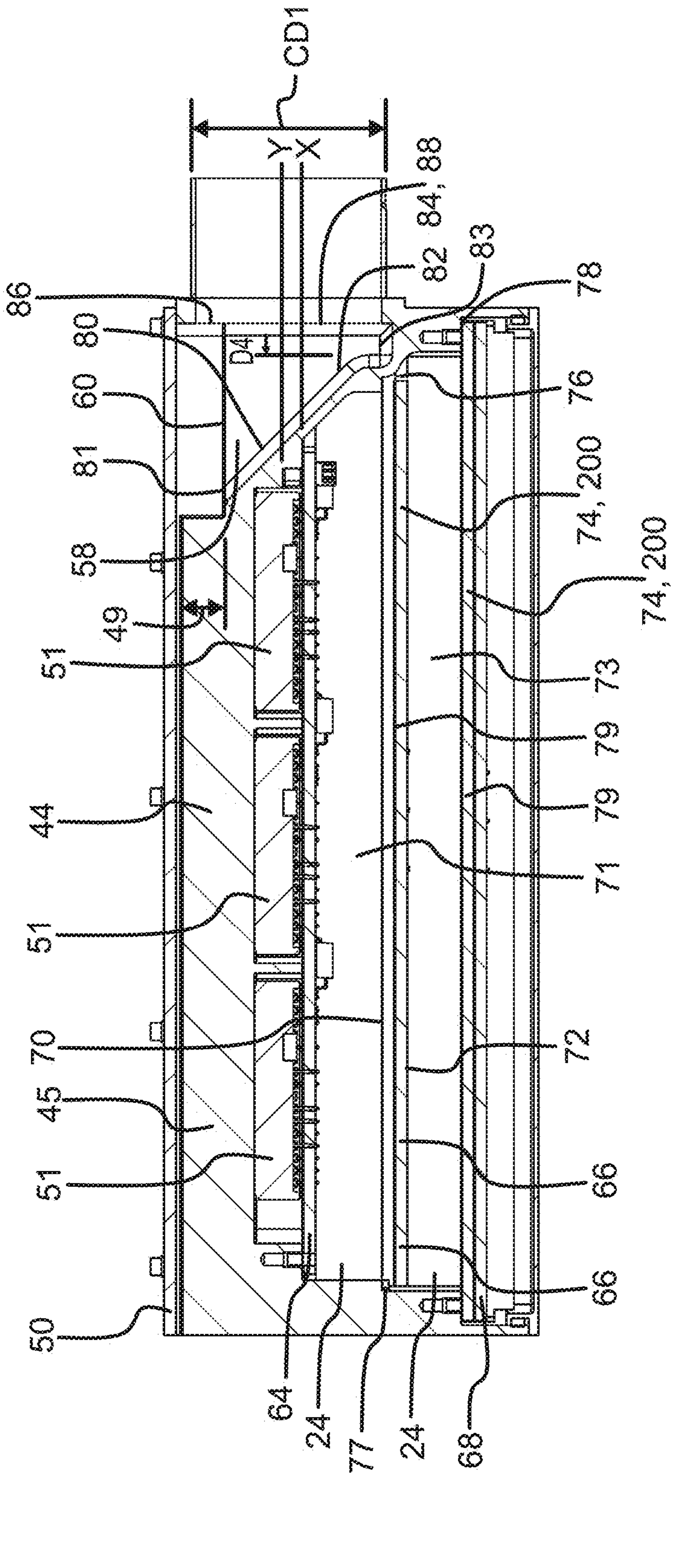
FIG. 7 is cross sectional view of the of the electric motor controller of FIG. 1.

Referring to FIG. 6, when operated, the forced air source 28 blows air from outside the housing 22 through the plenum 58 (shown in FIG. 7). The forced air source 28 increases more at the center of the heat sink cooling chamber 46 than at outer edges of the heat sink cooling chamber 46. Air from the forced air source 28 flows through an opening 60 adjacent the first wall 45 into the heat sink cooling chamber 46. The opening 60 has a width along the dimension d3. The width of the opening 60 is shorter than a width of the heat sink chamber 46. As a non-limiting example, the width of the opening 60 may be shorter than the width of the heat sink chamber 46 by at least 10%. The cooling fins 48 extend longitudinally along the dimension d2 forming the lengths of air-flow channels 52 and each fin 48 has a height 49 that extend along the first dimension d1. The cooling fins 48 are separated from one another by the air-flow channels 52. The cooling fins 48 are spaced apart along the third dimension d3, and the separation of the cooling fins 48 define the widths of the plurality of air-flow channels 52 used to cool the heat sink 44. When assembled, the cover 50 (not shown in FIG. 6) is placed over the heat sink cooling chamber 46 and the fins 48.

Referring to FIG. 7, the sealed interior region 24 is positioned within the housing 22. A plurality of circuit boards 62 are positioned within the sealed interior region 24 and are arranged in a stacked configuration. The plurality of circuit boards 62 may include a first circuit board 64, a second circuit board 66, and a third circuit board 68. The first, second and third circuit boards 64,66,68 each include a first major side 70 that faces toward the first side 32 of the housing 22, and a second major side 72 that faces toward the second side 34 of the housing 22. The first circuit board 64 is positioned adjacent the first wall 45 of the housing and includes heat generating components 51, such as power modules 51, positioned at the first major side 70 of the first circuit board 64 which generate relatively large amounts of heat. The power modules 51 are configured to preferably contact the heat sink 44 either directly or through intermediate heat contact transfer pads. Due to the heat generated by the power modules 51, the first circuit board 64 generates more heat than either the second circuit board 66 or third circuit board 68. The first circuit board 64 is placed adjacent to the heat sink 44 to improve cooling of the larger amount of heat generated by the power modules. The second circuit board 66 is positioned between the first and third circuit boards 64,68. The third circuit board 68 is positioned adjacent the second side 34 of the housing.

A first air gap 71 is positioned between the first and second circuit boards 66,68. A second air gap 73 are positioned between the second, and third circuit boards (66,68). A vapor chamber 74 for heat transfer from the circuit boards on each of the second and third circuit boards 66,68 boards. The vapor chambers 74 are positioned at the first major sides 70 of the second and third circuit boards 66,68 for transferring heat from heat generating components 79 of the second and third circuit boards 66,68 to a perimeter of the sealed interior region 24 defined by the third, fourth, fifth, and six sides 36, 38, 40, 42 of the housing. The housing 22 defines a first perimeter shoulder 76 within the sealed interior region 24 of the housing against which a perimeter 77 of the vapor chamber 74 positioned at the first major side 70 of the second circuit board 66 seats. The housing 22 further defines a second perimeter shoulder 78 within the sealed interior region 24 of the housing 22 against which a perimeter of the vapor chamber 74 positioned at the first major side 70 of the third circuit board 68 seats.

Lengths of the first, second, and third circuit boards 64, 66, 68 may be different caused by the stacked configuration of the circuit boards 60 and an angle of a second wall 80 of the sealed interior region 24. The angle of the second wall creates a space that is wider than the space allowed for the first circuit board 64. Accordingly, the second circuit board 66 may be longer than the first circuit board 64 and shorter than the third circuit board 68. The third circuit board 68 may be longer than both the first and second circuit boards 64,66. The first circuit board 64 is seated within the sealed interior region 24 adjacent the first side 32 and first wall 45 of the housing 22. The length of the first circuit boards 64 extends approximately from the fourth side 38 to the second wall 80 of the plenum 58. The second circuit board 66 is seated on the first perimeter shoulder 76 of the sealed interior region 24 below the second wall 80. The length of the second circuit board 66 extends approximately from the fourth side 38 to the third side 36 of the housing. The third circuit board 68 is seated on the second perimeter shoulder 78 on the sealed interior region 24 below both the first and second circuit board 64, 66. The length of the third circuit board 68 extends approximately from the fourth side 38 to the third side 36 of the housing. The second and third circuit boards 66,68 may be cooled by the inclusion of the vapor chambers 74. In some examples, vapor chambers 74 may be configured as a vapor chamber assembly 200 (shown in FIG. 13). A first vapor chamber assembly 200 (shown in FIG. 13) is positioned between the first perimeter shoulder 76 and the second circuit board 66. A second vapor chamber assembly 200 is positioned between the second perimeter shoulder 78 and the third circuit board 68.

Air flow from the plenum 58 into the sealed interior region 24 is restricted by the first wall 45 of the housing and a second wall 80 of the plenum 58 prevent the air flowing from the plenum and air channels from flowing into the sealed interior region 24. The air-flow plenum 58 is defined at least in part by the second wall 80 of the housing that is located at the third side 36 of the housing and that is obliquely angled relative to a direction d4 of air flow of the air from the forced air source 28. The second wall 80 is configured to deflect the air flow from the forced air source toward the air-flow channels 52. The second wall 80 separates the air-flow plenum 58 from the scaled interior region 24 and is obliquely angled relative to the major first and second sides 70,72 of the first circuit board 64. The first major side 70 of the first circuit board 64 defines a reference plane X that intersects the second wall 80. The second wall 80 has a first end 81 adjacent an entrance of the air-flow channels 52 and an opposite second end 82 adjacent the second circuit board 66, and wherein an air exit 59 of the flow channels 52 is adjacent the fourth side 38 of the housing.

The second wall 80 is obliquely angled at an angle in the range of 40-70 degrees relative to the first and second major sides 70,72 of the first circuit board 64 and relative to the direction d4 of air flow from the forced air source 28. The plenum 58 defines a notch 83 adjacent the second end 82 of the second wall 80 for causing swirling of the air flow adjacent the second end 82 of the second wall 80. The notch 38 is a wall that is part of the plenum 58. The notch 83 may additionally be adjacent a second circuit board 66. The notch 83 provides improved cooling of the second wall 80 and third side 36 the housing, which in turn provides improved cooling to the second and third circuit boards 66,68. The notch 83 is configured to draw heat from the vapor chamber 74 of the second circuit board 66. The second wall 80 extends from the notch 83 to the first side 32 of the housing 22. The forced air source 28 is positioned adjacent to the notch 83. Air flow from the forced air source 28 is able to circulate within the notch 83 and provide cooling of the third side 36 of the housing 22. The forced air source 28 includes an outlet 84 having a first region 86 that opposes an entrance to the air-flow channels 52 and a second region 88 that opposes the second wall 80. The forced air source 28 is at least partially positioned aligned with the heat sink cooling chamber 46 along the dimension d2. As a result, a length of the forced air source 28 along the dimension d2 extends at least partially above the first side 32 of the housing 22 to blow air directly into to the air-flow channels 52 for improved air flow.

Figure 8:
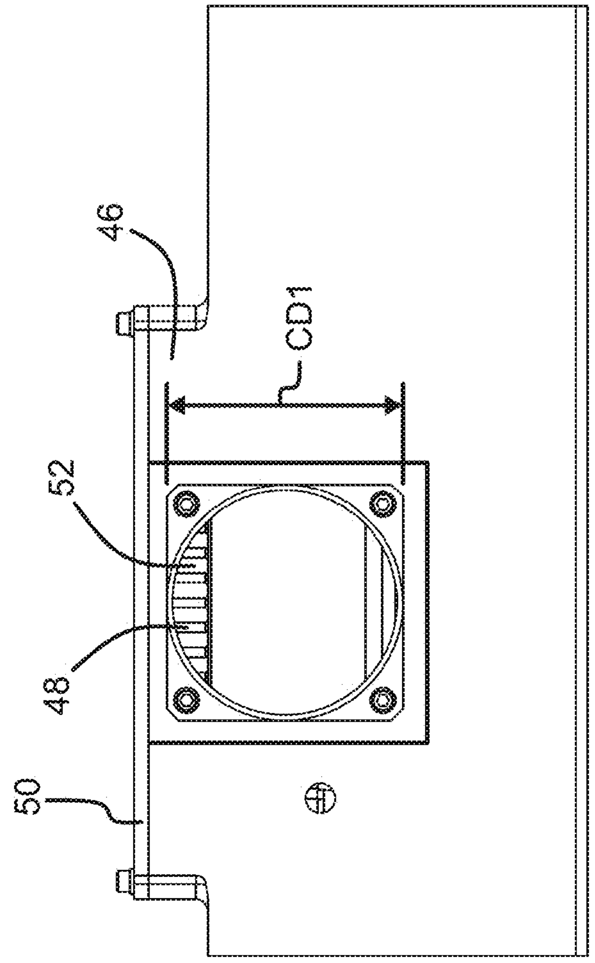
FIG. 8 is a side view of the electric motor controller of FIG. 1.

Referring to FIG. 8, the forced air source 28 forces air into the air-flow channels 52 between the fins 48. A ratio of a cross dimensional height CDI of the plenum to the height 49 of the fins is 2-3.5. In the depicted example, the cross dimensional height CDI of the plenum corresponds to the forced air source (e.g. the cross dimensional height CDI of the plenum corresponds to a diameter of the fan in the depicted example). At least a portion of the cross dimensional height of the forced air source 28 overlaps the height 49 of the fins. In certain examples, at least 10% of the cross dimensional height of the plenum overlaps the height of the fins. The forced air source 28 has a central axis Y (shown in FIG. 7) that intersects the second wall 80 and that is obliquely oriented relative to the second wall 80. In examples where the forced air source 28 is a fan, the central axis Y is a central fan axis.

Figure 9:
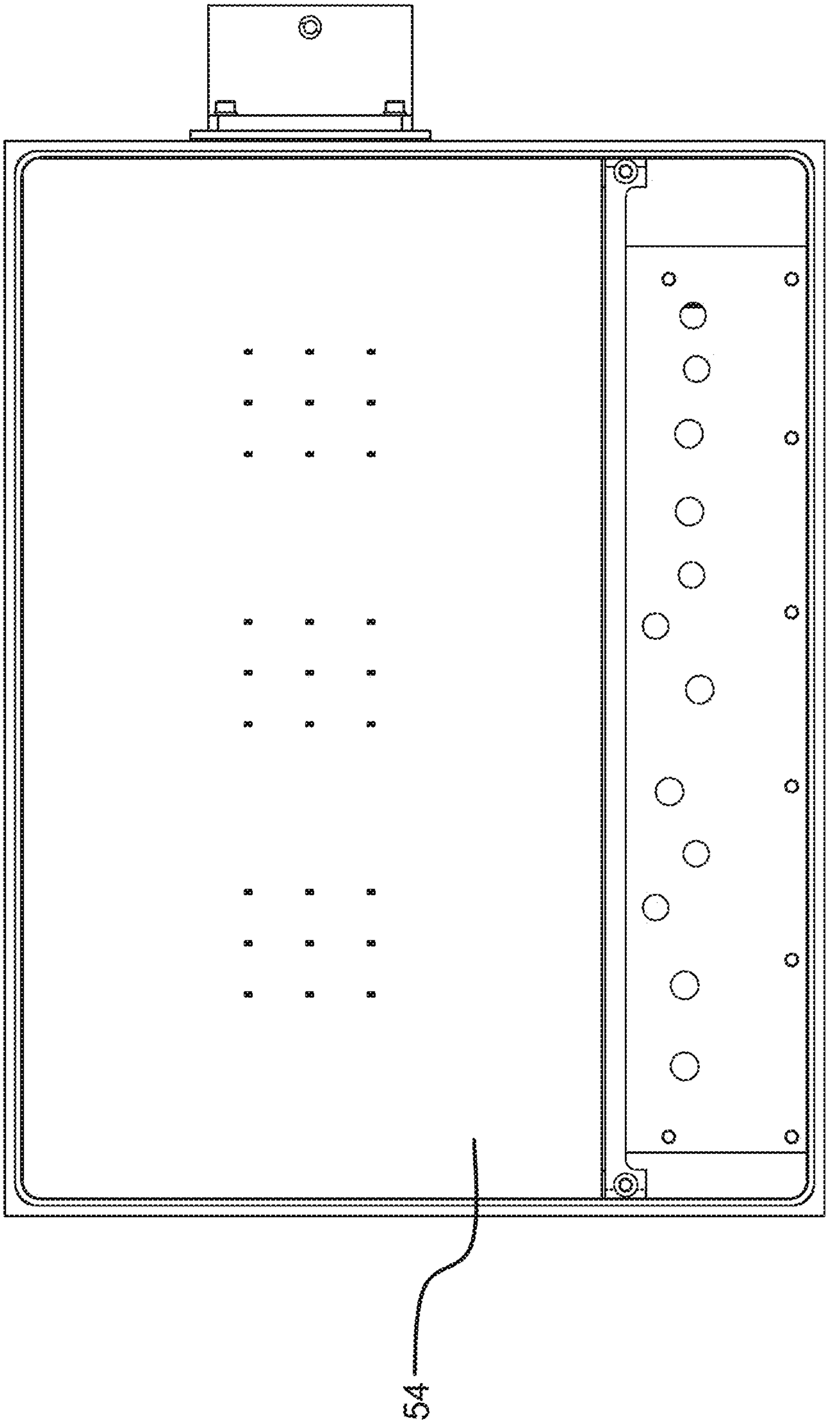
FIG. 9 is a bottom view of the electric motor controller of FIG. 1.
Figure 10:
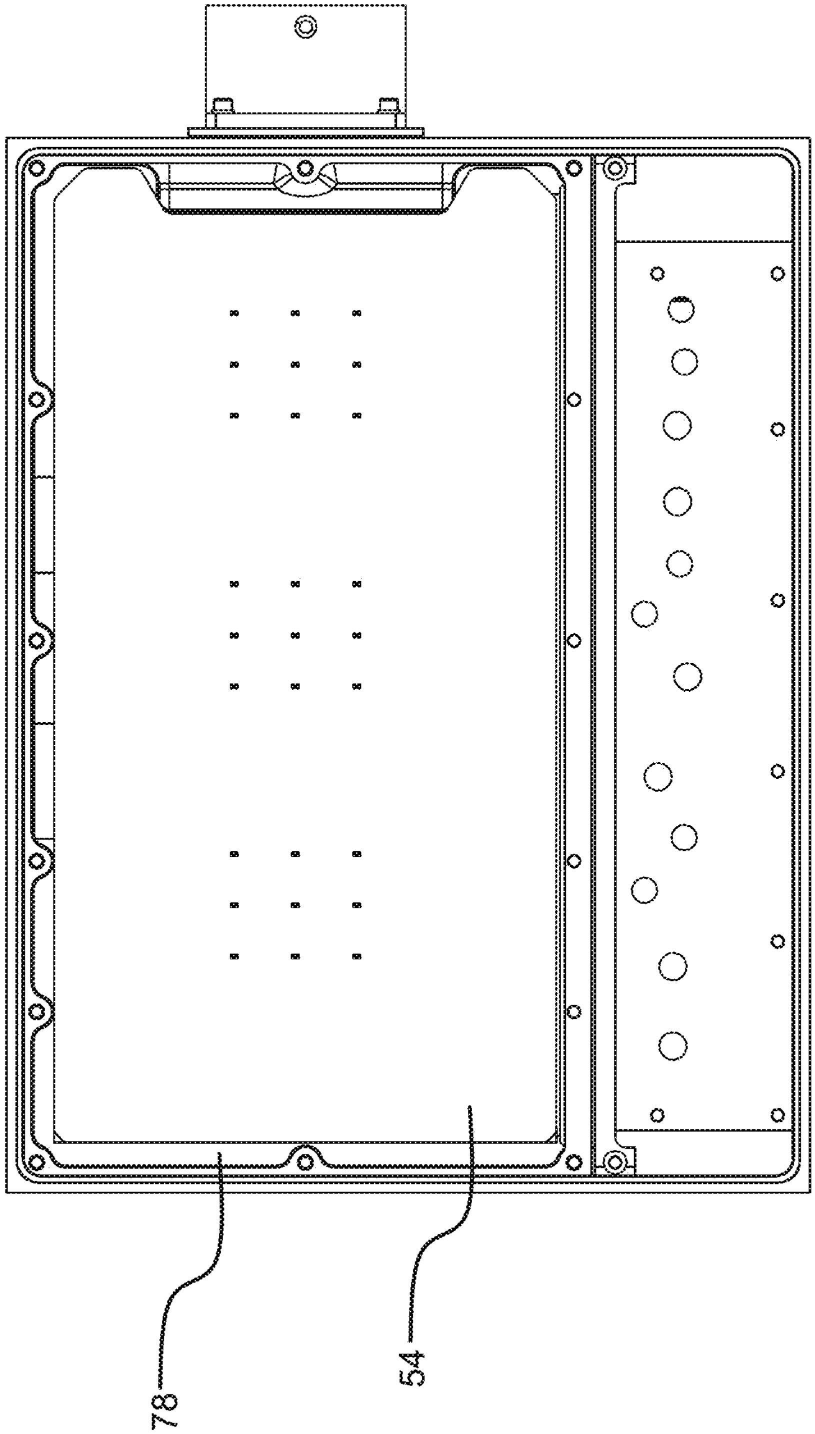
FIG. 10 is a sectional view of the bottom of the electric motor controller of FIG. 1.
Figure 11:
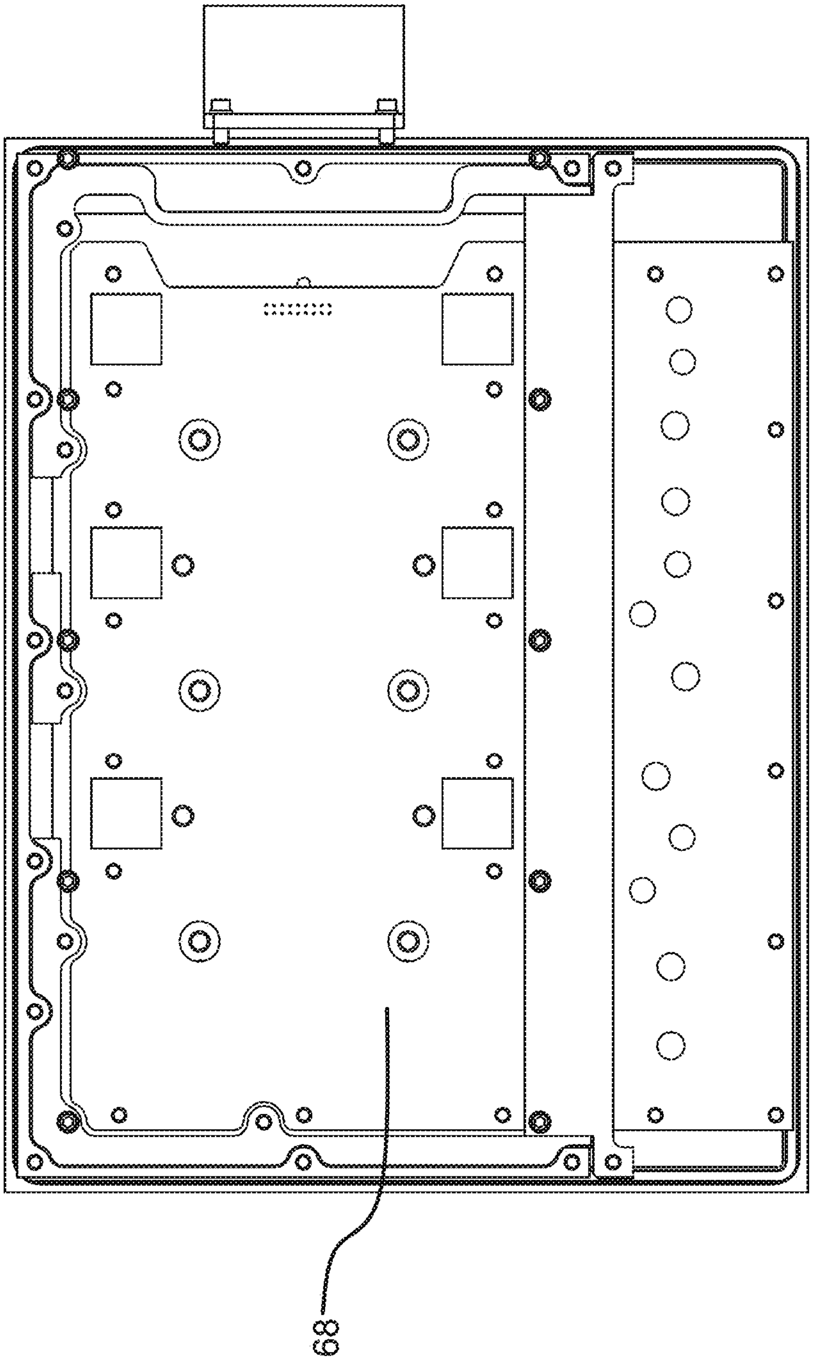
FIG. 11 is a sectional view of the bottom of the electric motor controller of FIG. 1.

Referring to FIG. 9, when assembling the electric motor controller 20, the second major side 72 of the third circuit board 68 (not shown) is positioned on the bottom cover 54 which seals the sealed interior region 24. FIG. 10 shows the second perimeter positioned above the bottom cover 54 relative to the second side 34. FIG. 11 shows the third circuit board 68 fastened to the second perimeter shoulder 78.

Figure 12:
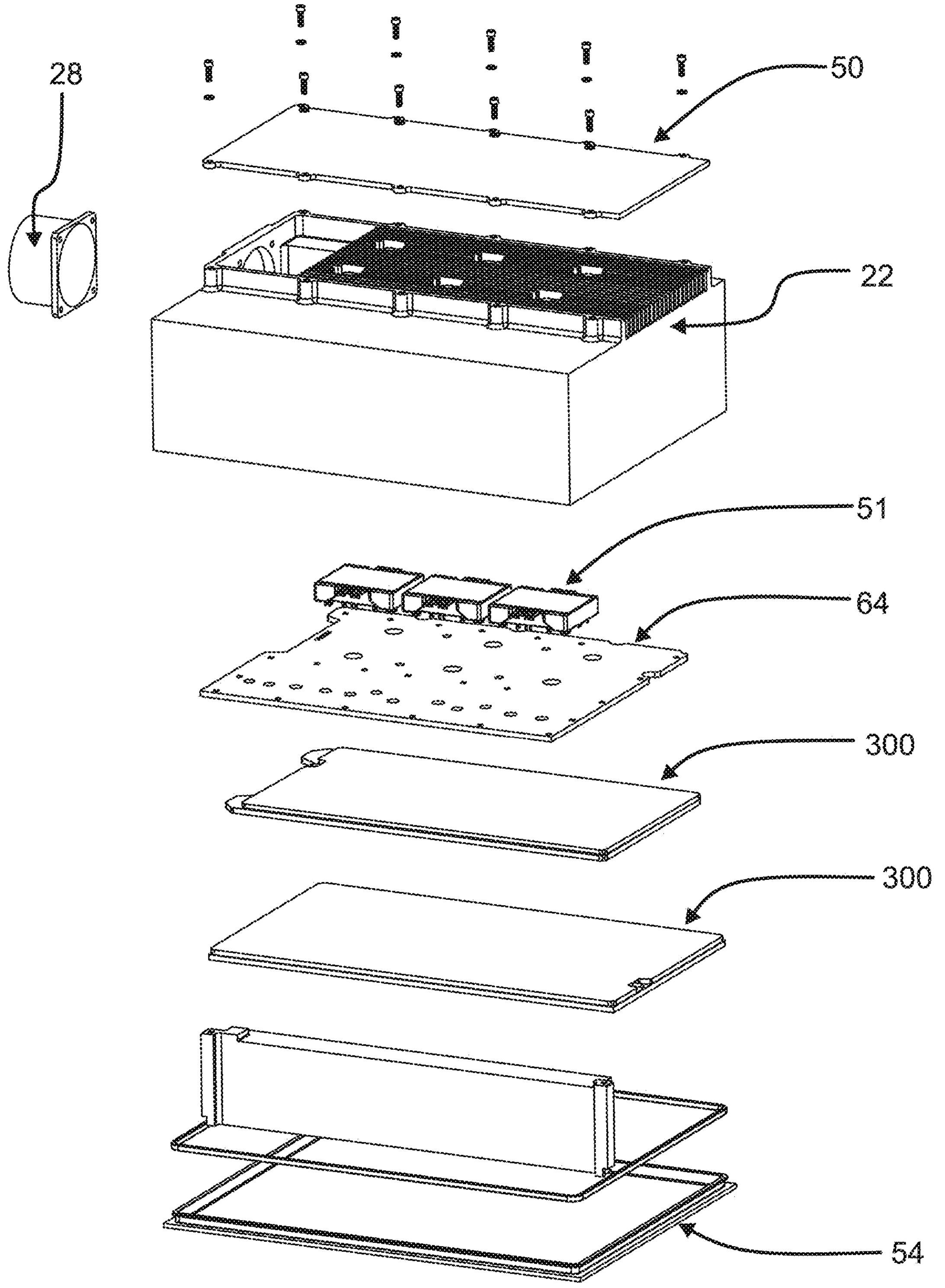
FIG. 12 is an exploded view of the electric motor controller of FIG. 1.

FIG. 12 illustrates an exploded view of the electric motor controller 20. Each of the second and third circuit boards 66,68 may be part of a circuit board assembly 300 (shown in FIG. 14).

Figure 13:
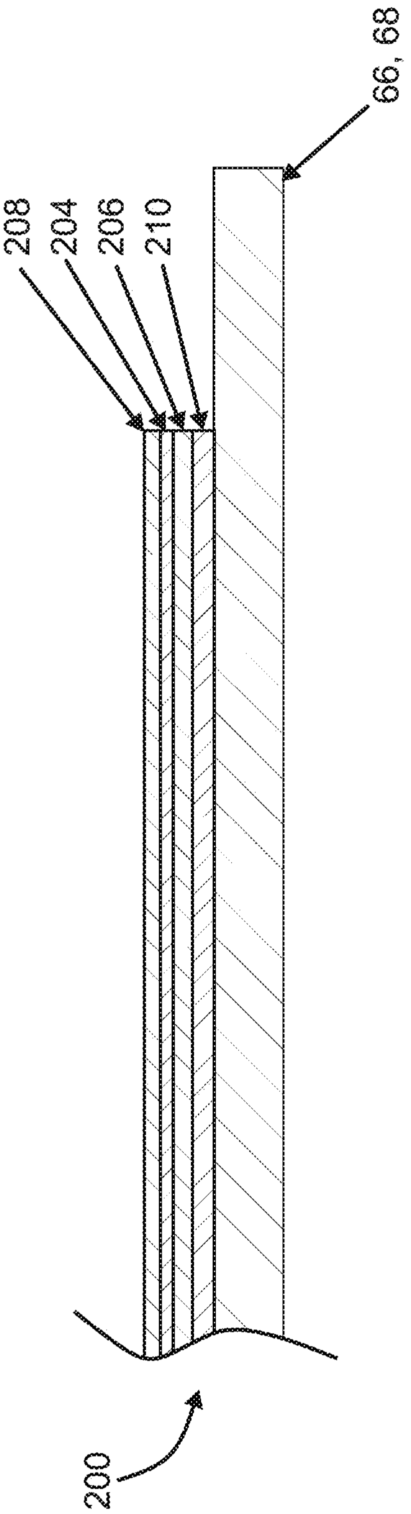
FIG. 13 is an exploded view of a power control board assembly for the electric motor controller of FIG. 1.

Referring to FIG. 13, each vapor chamber assembly 200 includes a plurality of layers 202. The plurality of layers 202 includes both a vapor region 204 and a wick region 206 positioned between a first copper layer 208 and a second copper layer 210. The vapor chamber assemblies 200 transfer heat from the second and third circuit boards 66,68 to the housing 22 at the third side 36. The vapor chamber assembly 200 is positioned on the first major side 70 of the second and third circuit boards 66,68. While operating, the circuit boards 66,68 generate heat which must be cooled by heat transfer. The second copper layer 210 is adjacent one of the circuit boards, and exchanges heat to the wick region 206. The wick region 206 includes liquid, such as water, which vaporizes after exchanging heat from the second copper layer 210 and rises to the top of the vapor region 204. The vapor transfers the heat to the first copper layer 208 positioned adjacent the vapor region 204. The vapor then condenses and returns to a liquid state. The liquid flows back down to the wick region 206. The liquid is then capable of again accepting heat transfer from the second copper layer 210. Example vapor chamber assemblies 200 are disclosed by U.S. Pat. No. 10,561,041 which is incorporated by reference in its entirety.

Figure 14:
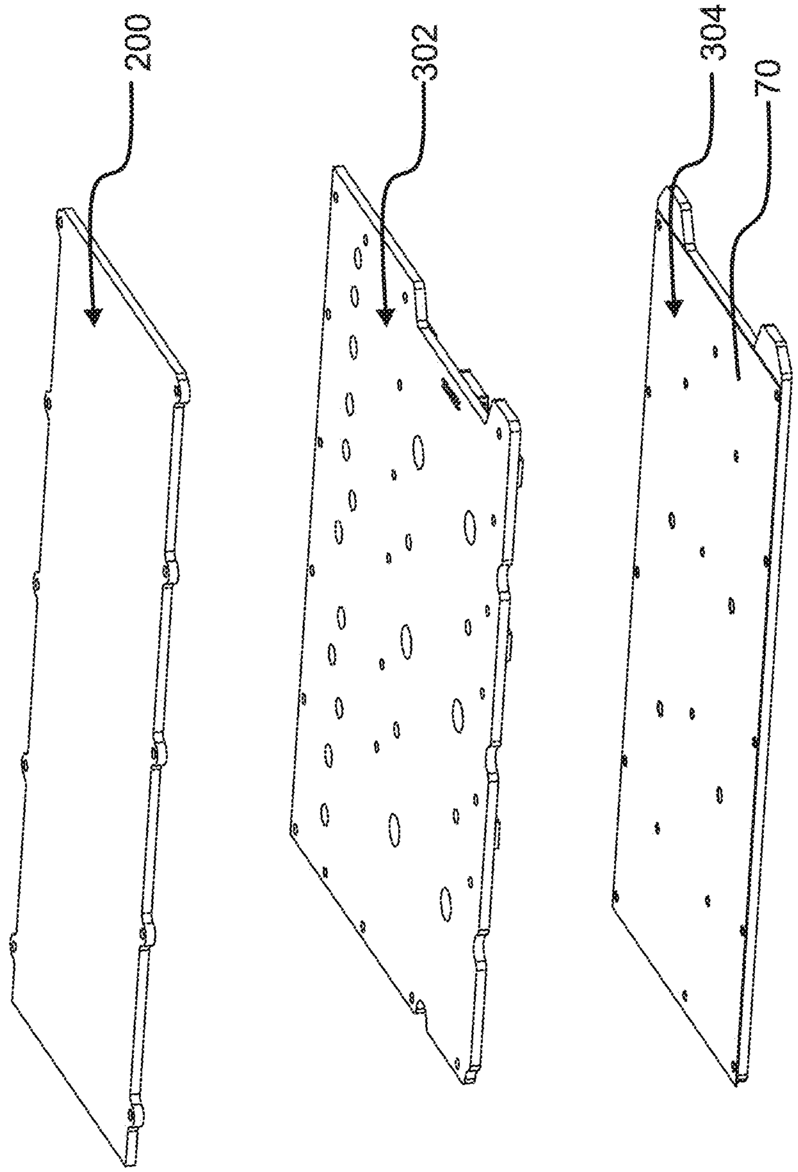
FIG. 14 is a view of the vapor chamber assembly.

Referring to FIG. 14, each circuit board assembly 300 comprises the vapor chamber assembly 200, a thermal pad 302, and a circuit board 304. The vapor chamber assembly 200 and the thermal pad 302 are positioned on the first major side 70 of the circuit board 304. The thermal pad 302 is positioned between the vapor chamber 74 and the circuit board 304. The vapor chamber assembly 200 and thermal pad 302 may be joined to the circuit board 304 by fasteners. The circuit board assembly may additionally comprise other electrical components necessary to control the motor.

The various examples described above are provided by way of illustration only and should not be construed to limit the scope of the present disclosure. Those skilled in the art will readily recognize various modifications and changes that may be made without following the examples and applications illustrated and described herein, and without departing from the true spirit and scope of the present disclosure.

What is claimed is:

1. An electric controller comprising:

a housing having a sealed interior region, the housing including first and second sides separated by a first dimension d1, the housing also including third and fourth sides that extend between the first and second sides and that are separated by a second dimension d2 that is transverse with respect to the first dimension d1, the housing further including fifth and sixth sides that extend between the first and second sides and also extend between the third and fourth sides, the fifth and sixth sides being separated by a third dimension d3 that is transverse with respect to the first dimension d1 and the second dimension d2;

a plurality of circuit boards arranged in a stacked configuration within the sealed interior region of the housing, the plurality of circuit boards including a first circuit board, a second circuit board and a third circuit board, the second circuit board being positioned between the first and third circuit boards, the first, second and third circuit boards each including a first major side that faces toward the first side of the housing and a second major side that faces toward the second side of the housing, the first circuit board being positioned adjacent the first side of the housing, and the first circuit board including heat generating components positioned at the first major side of the first circuit board;

the first side of the housing including a first wall having a heat sink integrated with the first wall, the heat sink including a plurality of spaced-apart cooling fins located outside the sealed interior region, the plurality of spaced-apart cooling fins being spaced-apart along the third dimension d3, the plurality of spaced-apart cooling fins having lengths that extend along the second dimension d2 and heights that extend along the first dimension d1, the plurality of spaced-apart cooling fins being separated from one another by air-flow channels, and the heat sink being configured to transfer heat generated by the heat generating components at the first circuit board from the sealed interior region to the plurality of spaced-apart cooling fins; and the housing defining an air-flow plenum at the third side of the housing for directing air flow from a forced air source to the air-flow channels, the air-flow plenum being defined at least in part by a second wall of the housing that is located at the third side of the housing and that is obliquely angled relative to a direction of air flow of the air flow from the forced air source, the second wall being configured to deflect the air flow from the forced air source toward the air-flow channels, the second wall separating the air-flow plenum from the sealed interior region and being obliquely angled relative to the first and second major sides of the first circuit board, the first major side of the first circuit board defining a reference plane that intersects the second wall.

2. The electric controller of claim 1, further comprising vapor chambers positioned at the first major sides of the second and third circuit boards for transferring heat from heat generating components of the second and third circuit boards to a perimeter of the sealed interior region defined by the third, fourth, fifth and sixth sides of the housing.

3. The electric controller of claim 2, wherein the housing defines a first perimeter shoulder within the sealed interior region of the housing against which a perimeter of the vapor chamber positioned at the first major side of the second circuit board seats, and wherein the housing defines a second perimeter shoulder within the sealed interior region of the housing against which a perimeter of the vapor chamber positioned at the first major side of the third circuit board seats.

4. The electric controller of claim 1, wherein the second wall has a first end adjacent an entrance of the air-flow channels and an opposite second end adjacent the second circuit board, and wherein an air exit of the air-flow channels is adjacent the fourth side of the housing.

5. The electric controller of claim 4, wherein the plenum includes a notch adjacent the opposite second end of the second wall for causing swirling of the air flow adjacent the opposite second end of the second wall.

6. The electric controller of claim 1, wherein the second wall has a first end adjacent an entrance of the air-flow channels and an opposite second end, and wherein the plenum includes a notch adjacent the opposite second end of the second wall for causing swirling of the air flow adjacent the opposite second end of the second wall.

7. The electric controller of claim 1, wherein the plenum includes a notch for causing swirling of the air flow within the plenum.

8. The electric controller of claim 1, wherein the forced air source is a fan, and wherein the fan includes an outlet having a first region that opposes an entrance to the air-flow channels and a second region that opposes the second wall.

9. The electric controller of claim 8, wherein the fan has a central fan axis that intersects the second wall and that is obliquely oriented relative to the second wall.

10. The electric controller of claim 1, wherein the second wall is obliquely angled at an angle in the range of 40-70 degrees relative to the first and second major sides of the first circuit board and relative to the direction of the air flow from the forced air source.

11. The electric controller of claim 1, wherein the heat generating source are power modules.

12. An electric controller comprising:

a housing with an interior;

a plurality of circuit boards arranged in a stacked configuration within the interior; the plurality of circuit boards including at least a first circuit board and a second circuit board;

a first wall of the housing having a heat sink integrated with the first wall, the heat sink including a plurality of cooling fins located outside the interior of the housing; the plurality of cooling fins defining an air-flow channel between each of the plurality of cooling fins; the first circuit board including heat generating components positioned on the first circuit board, the heat sink being configured to transfer heat generated by the heat generating components on the first circuit board from the interior to the plurality of cooling fins; and the housing defining a plenum for directing air flow from a forced air source to the air-flow channel; the plenum being defined at least in part by a second wall separating the plenum from the interior of the housing, the second wall obliquely angled relative to a direction of air flow of the air from the forced air source, wherein air directed through the plenum flows over the second wall and through the air-flow channel.

13. The electric controller of claim 12, wherein the plurality of circuit boards further includes a third circuit board.

14. The electric controller of claim 13, wherein a vapor chamber is positioned on each of the second circuit board and the third circuit board.

15. The electric controller of claim 12, wherein the second wall has a first end adjacent an entrance of the air-flow channel and an opposite second end, and wherein the plenum includes a notch adjacent the opposite second end of the second wall for causing swirling of the air flow adjacent the second end of the second wall.

16. The electric controller of claim 12, wherein the second wall is obliquely angled relative to the first wall.

17. The electric controller of claim 12, wherein the second wall is obliquely angled relative to each of the plurality of circuit boards.

18. The electric controller of claim 12, wherein the forced air source is a fan with an axis intersecting the second wall and the second wall is obliquely angled relative to the axis of the fan.

19. The electric controller of claim 18, wherein the second wall is obliquely angled at a range of 40-70 degrees relative to the first wall, the plurality of circuits boards, and the axis of the fan.

20. The electric controller of claim 12, wherein the interior of the housing is a sealed interior region, and a vapor chamber is positioned on at least the second circuit board.

21. The electric controller of claim 12, wherein a cross dimensional height of the plenum relative to a height of the plurality of cooling fins has a ratio of 2-3.5.

22. The electric controller of claim 12, wherein a cross dimensional height of the plenum at least partially overlaps a height of a cooling fin region.

* * * * *